(12) United States Patent
Mizusawa (10) Patent No.: US 8,570,110 B2
(45) Date of Patent: Oct. 29, 2013

(54) SURFACE MOUNT TYPE CRYSTAL UNIT (75) Inventor: Shuichi Mizusawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 29 days.

(21) Appl. No.: 13/384,352

(22) PCT Filed: Jun. 16, 2010

(86) PCT No.: PCT/JP2010/060596
§ 371 (c)(1),
(2), (4) Date: Feb. 15, 2012

(87) PCT Pub. No.: WO2011/010521
PCT Pub. Date: Jan. 27, 2011

(65) Prior Publication Data
US 2012/0133447 A1 May 31, 2012

(30) Foreign Application Priority Data

Jul. 23, 2009 (JP) .................................. 2009-172128
May 6, 2010 (JP) .................................. 2010-106077

(51) Int. Cl.
*H03B 1/00* (2006.01)
*H03B 5/32* (2006.01)
*H01L 41/047* (2006.01)
*H01L 41/053* (2006.01)

(52) U.S. Cl.
USPC ............. 331/68; 331/158; 310/344; 310/348; 310/365

(58) Field of Classification Search
USPC ................. 29/25.35; 310/311, 340, 341, 344, 310/346–349, 365; 331/68–70, 108 C, 331/108 D, 116 FE, 116 M, 116 R, 154, 158
See application file for complete search history.

(56) References Cited

U.S. PATENT DOCUMENTS 6,087,759 A *  7/2000  Pfeil ............................ 310/321
6,407,482 B2 *  6/2002  Sakata et al. .................. 310/328

(Continued)

FOREIGN PATENT DOCUMENTS

JP    2000-223996    8/2000
JP    2008-109676    5/2008

OTHER PUBLICATIONS

International Search Report of PCT/JP2010/060596 dated Aug. 16, 2010.

*Primary Examiner* — Levi Gannon
(74) *Attorney, Agent, or Firm* — Edwards Wildman Palmer LLP; Scott D. Wofsy (57) ABSTRACT

An object of the invention is to provide a surface mount oscillator that can suppress a change with the lapse of time in frequency characteristics. A surface mount type crystal unit 1 includes: a framed crystal plate 2 in which an oscillating part 6 having a first excitation electrode 5a and a second excitation electrode 5b on opposite principal surfaces thereof is surrounded by a frame 7, and the oscillating part 6 and the frame 7 are connected by connecting parts 8a and 8b; a base 3; and a cover 4. The surface mount type crystal unit 1 has such a configuration that a first metal film 17 is formed in one area of two areas formed by dividing the principal surface of the frame 7 facing the base 3 at two positions around a circumferential direction of the frame 7, and a second metal film 18 is formed in the other area. The first metal film 17 is electrically connected to the first excitation electrode 5a, and the second metal film 18 is electrically connected to the second excitation electrode 5b. The frame 7 and the base 3 are bonded to each other by a sealing material 20 formed on surfaces of the first metal film and the second metal film, and a gap area 19 between the first metal film 17 and the second metal film 18 is filled with glass 21, thereby hermetically sealing the oscillating part 6.

3 Claims, 10 Drawing Sheets

(56) References Cited

U.S. PATENT DOCUMENTS

| | | | |
|---|---|---|---|
| 7,358,652 B2 * | 4/2008 | Aratake et al. | 310/340 |
| 7,439,658 B2 * | 10/2008 | Aratake | 310/344 |
| 7,518,291 B2 * | 4/2009 | Tanaya | 310/348 |
| 7,605,521 B2 * | 10/2009 | Kuwahara | 310/344 |
| 7,626,317 B2 * | 12/2009 | Nakai et al. | 310/365 |
| 8,063,542 B2 * | 11/2011 | Ono et al. | 310/348 |
| 8,069,549 B2 * | 12/2011 | Nagano et al. | 29/594 |
| 2001/0017505 A1 * | 8/2001 | Aratake et al. | 310/340 |
| 2006/0255691 A1 * | 11/2006 | Kuroda et al. | 310/348 |
| 2012/0074816 A1 * | 3/2012 | Mizusawa | 310/344 |

* cited by examiner

PRIOR ART

PRIOR ART

PRIOR ART

SURFACE MOUNT TYPE CRYSTAL UNIT

TECHNICAL FIELD

The present invention relates to a surface mount type crystal unit (hereinafter, referred to as a "surface mount oscillator"), and more specifically, relates to a surface mount oscillator in which a base and a cover are bonded to opposite principal surfaces of a crystal plate, whose oscillating part is surrounded by a frame.

BACKGROUND ART

Because the surface mount oscillator is small and light, it is widely adopted as a reference source of frequency and time, particularly in portable electronic equipment. Recently, the consumption of surface mount oscillators is increasing in response to an information-intensive society, and a surface mount oscillator with high productivity and high quality has been desired. As one such surface mount oscillator, there is a surface mount oscillator in which a base and a cover are bonded to opposite principal surfaces of a crystal plate, whose oscillating part is surrounded by a frame.

Figure 8:
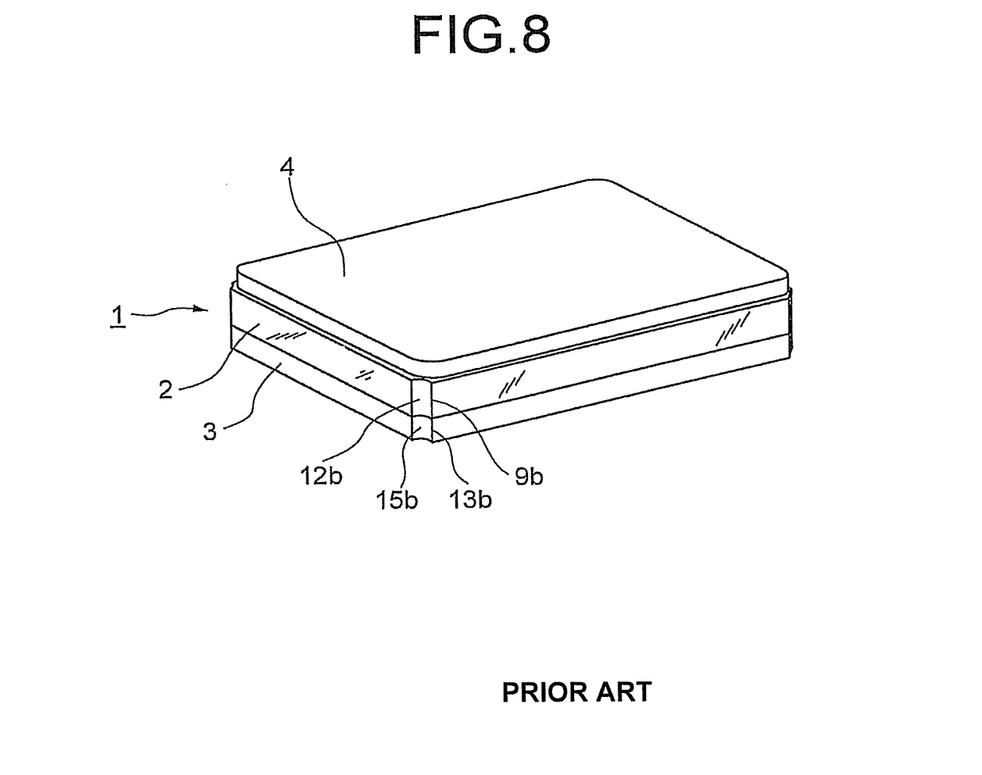
FIG. 8 is a perspective view for explaining a conventional example of the surface mount type crystal unit.
Figure 9:
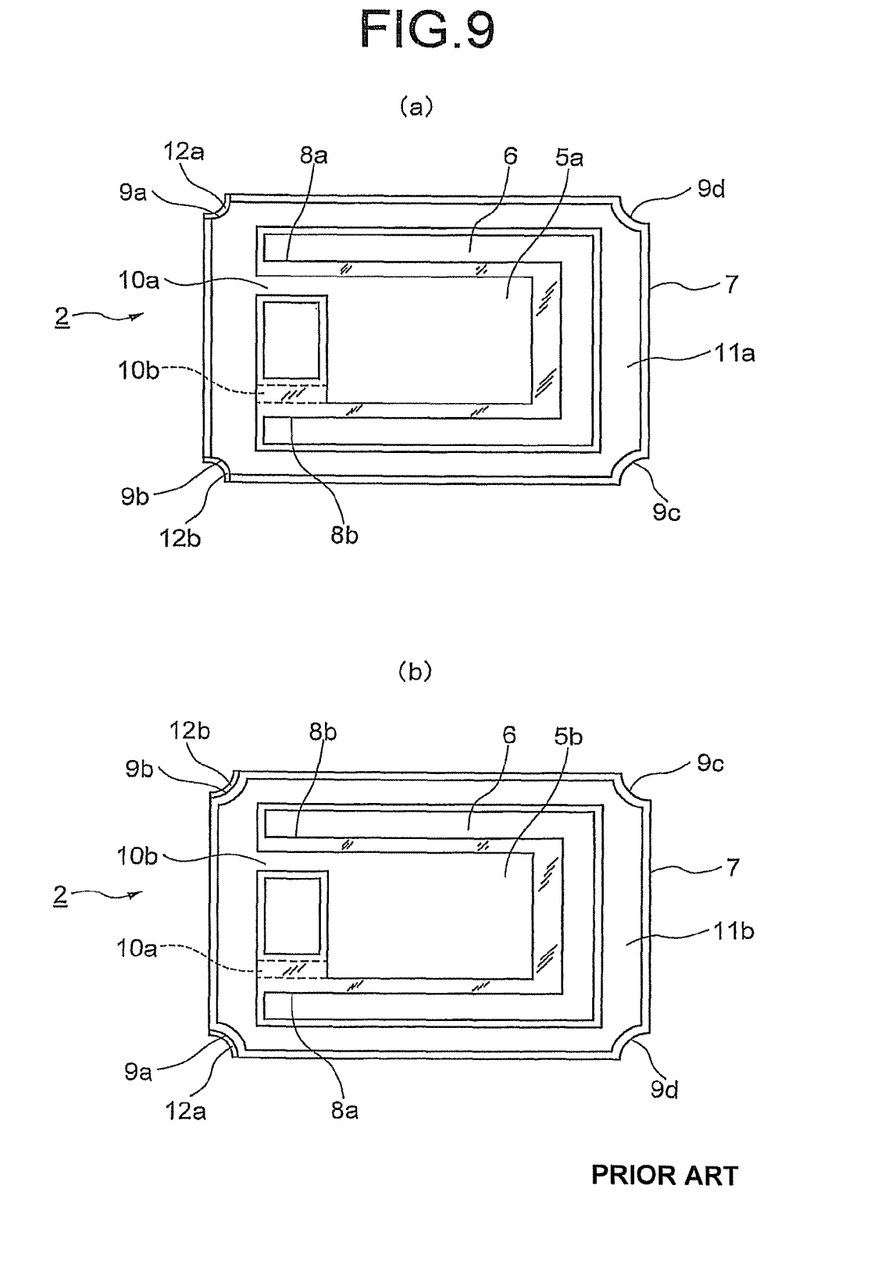
FIG. 9 is a diagram for explaining a conventional example of the framed crystal plate.
Figure 10:
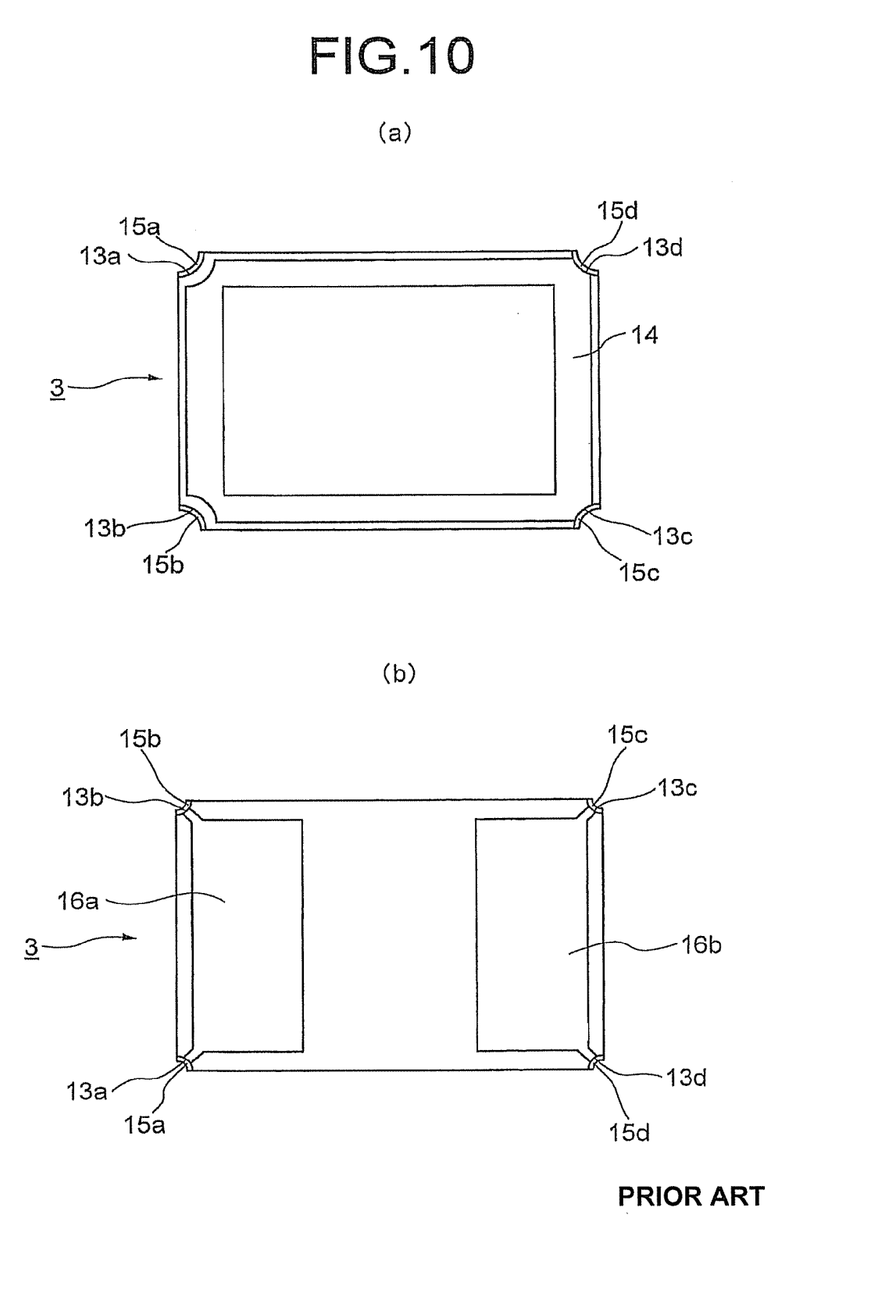
FIG. 10 is a diagram for explaining a conventional example of the base.

FIG. 8 to FIG. 10 are diagrams for explaining one conventional example of the surface mount oscillator. FIG. 8 is a perspective view thereof, FIG. 9 (a) is a plan view of one principal surface of a framed crystal plate, FIG. 9 (b) is a plan view of the other principal surface of the crystal plate, FIG. 10 (a) is a plan view of one principal surface of a base, and FIG. 10 (b) is a plan view of the other principal surface of the base.

As shown in FIG. 8, a surface mount oscillator 1 in the conventional example is formed by bonding a base 3 made of ceramic and a cover 4 made of Kovar to opposite principal surfaces of a framed crystal plate 2.

Moreover, as shown in FIG. 9, the framed crystal plate 2 includes an oscillating part 6 having a first excitation electrode 5a and a second excitation electrode 5b on the opposite principal surfaces, a frame 7 surrounding the oscillating part 6, and a first connecting part 8a and a second connecting part 8b that extend from opposite sides of one end of the oscillating part 6 to connect the oscillating part 6 with the frame 7. Frame notches 9a to 9d are formed at four corners on an outer periphery of the frame 7 in a planar view.

As shown in FIG. 9, the first excitation electrode 5a facing the cover 4 is electrically connected to a frame metal film 11a formed on a principal surface of the frame 7 facing the cover 4, via an electrically-conducting path 10a formed in the first connecting part 8a. On the other hand, the second excitation electrode 5b facing the base 3 is electrically connected to a frame metal film 11b formed on a principal surface of the frame 7 facing the base 3, via an electrically-conducting path 10b formed in the second connecting part 8b.

The frame metal films 11a and 11b are formed, as shown in FIG. 9, over the whole periphery of the frame 7. As shown in FIG. 9 (a), the frame metal film 11a is electrically connected to frame end-face electrodes 12a and 12b formed on the side portions of the frame notches 9a and 9b. Further, as shown in FIG. 9 (b), the frame metal film 11b is formed away from the frame notches 9a to 9d, and is not electrically connected to the frame end-face electrodes 12a and 12b.

The framed crystal plate 2, the cover 4, and the base 3 are bonded by using a eutectic alloy (for example, AuGe) formed on the surfaces of the frame metal films 11a and 11b.

As shown in FIG. 10, base notches 13a to 13d are formed at four corners of the base 3 in a planar view. The base notches 13a to 13d respectively correspond to the frame notches 9a to 9d formed in the crystal plate 2.

Moreover, as shown in FIGS. 10 (a) and (b), a base metal film 14 is formed to face the frame metal film 11b formed in the crystal plate 2. The frame metal film 11b and the base metal film 14 are electrically connected to each other via a eutectic alloy. The base metal film 14 is formed away from the base notches 13a and 13b. However, the base metal film 14 is extended to the base notches 13c and 13d and electrically connected to base end-face electrodes 15c and 15d formed on the side portions of the base notches 13c and 13d.

As shown in FIG. 10 (a), the base end-face electrodes 15c and 15d are electrically connected to a mounting terminal 16b formed on the principal surface of the base 3 serving as an external bottom face of the surface mount oscillator 1. The mounting terminal 16b is formed at one end of the principal surface of the base 3, and a mounting terminal 16a is formed at the other end thereof. The mounting terminal 16a is electrically connected to the frame end-face electrodes 12a and 12b via the base end-face electrodes 15a and 15b formed on the side portions of the base notches 13a and 13b.

Electrical connection of the surface mount oscillator in the conventional example can be summarized as follows. That is, the first excitation electrode 5a shown in FIG. 9 is electrically connected to the mounting terminal 16a via the electrically-conducting path 10a, the frame metal film 11a, the frame end-face electrodes 12a, 12b, and the base end-face electrodes 15a, 15b. The second excitation electrode 5b is electrically connected to the mounting terminal 16b via the electrically-conducting path 10b, the frame metal film 11b, the base metal film 14, and the base end-face electrodes 15c, 15d.

[Patent Document 1] Japanese Unexamined Patent Publication No. 2000-223996

SUMMARY OF THE INVENTION

Problems to be Solved by the Invention

However, in the surface mount oscillator 1 in the conventional example having the above-described configuration, the base 3, the framed crystal plate 2, and the cover 4 are bonded together by using a eutectic alloy such as AuGe. Consequently, metal gas is generated at the time of bonding, and frequency characteristics of the surface mount oscillator 1 change with the lapse of time. The metal gas is generated under high temperature when a gas derived from oxides such as the eutectic alloy is heated.

It is an object of the present invention to provide a surface mount oscillator that can suppress a change with the lapse of time in the frequency characteristics.

Means for Solving the Problems

The present invention provides a surface mount type crystal unit comprising: a framed crystal plate in which an oscillating part having a first excitation electrode and a second excitation electrode on opposite principal surfaces thereof is surrounded by a frame, and the oscillating part and the frame are connected by a connecting part; and a base and a cover bonded to opposite principal surfaces of the frame to hermetically seal the oscillating part. The surface mount type crystal unit has such a configuration that a first metal film is formed in one area of two areas formed by dividing the principal surface of the frame facing the base at two positions around a circumferential direction of the frame, and a second metal film is formed in the other area, the first metal film is electrically connected to the first excitation electrode, the second metal film is electrically connected to the second excitation electrode, the frame and the base are bonded to each other by a sealing material formed on surfaces of the first metal film and the second metal film, and a gap area between the first metal film and the second metal film is filled with glass, thereby hermetically sealing the oscillating part.

According to such a configuration, after the frame and the base are first bonded, and the frame and the cover are bonded by the sealing material formed on the surfaces of the first metal film and the second metal film, the gap area between the first metal film and the second metal film is filled with glass, thereby forming a surface mount oscillator. Consequently, after at least a part of gas or the like generated by the sealing material or the like is discharged from the gap area between the first metal film and the second metal film, the gap area is filled with glass. As a result, a change with the lapse of time in the frequency characteristics of the surface mount oscillator can be suppressed.

Moreover, in the present invention, a first connecting part and a second connecting part are provided as the connecting part. The first excitation electrode facing the cover is electrically connected to the first metal film via an electrically-conducting path formed on a side surface of the first connecting part and an electrically-conducting path formed on a principal surface thereof facing the base, and the second excitation electrode facing the base is electrically connected to the second metal film via an electrically-conducting path formed on a principal surface of the second connecting part facing the base.

Furthermore, in the present invention, the sealing material is made of AuGe, AuSi, AuSn, or SnAgCu.

BRIEF DESCRIPTION OF THE DRAWINGS

FIG. 1 (*a*) is a perspective view thereof, FIG. 1 (*b*) (before filling glass) and FIG. 1 (*c*) (after filling glass) are side views of the surface mount type crystal unit as seen from a direction of arrow A shown in FIG. 1 (*a*).

FIG. 2 (*a*) is a perspective view thereof, FIG. 2 (*b*) is a plan view of one principal surface thereof, and FIG. 2 (*c*) is a plan view of the other principal surface.

FIG. 3 (*a*) is a plan view of one principal surface thereof, and FIG. 3 (*b*) is a plan view of the other principal surface.

FIG. 5 (*a*) is a plan view of one principal surface thereof, and FIG. 5 (*b*) is a plan view of the other principal surface.

FIG. 6 (*a*) is a perspective view thereof, FIG. 6 (*b*) is a plan view of one principal surface thereof, and FIG. 6 (*c*) is a plan view of the other principal surface.

FIG. 7 (*a*) is a plan view of one principal surface thereof, and FIG. 7 (*b*) is a plan view of the other principal surface.

FIG. 9 (*a*) is a plan view of one principal surface thereof, and FIG. 9 (*b*) is a plan view of the other principal surface.

FIG. 10 (*a*) is a plan view of one principal surface thereof, and FIG. 10 (*b*) is a plan view of the other principal surface.

BEST MODE FOR CARRYING OUT THE INVENTION

Figure 1:
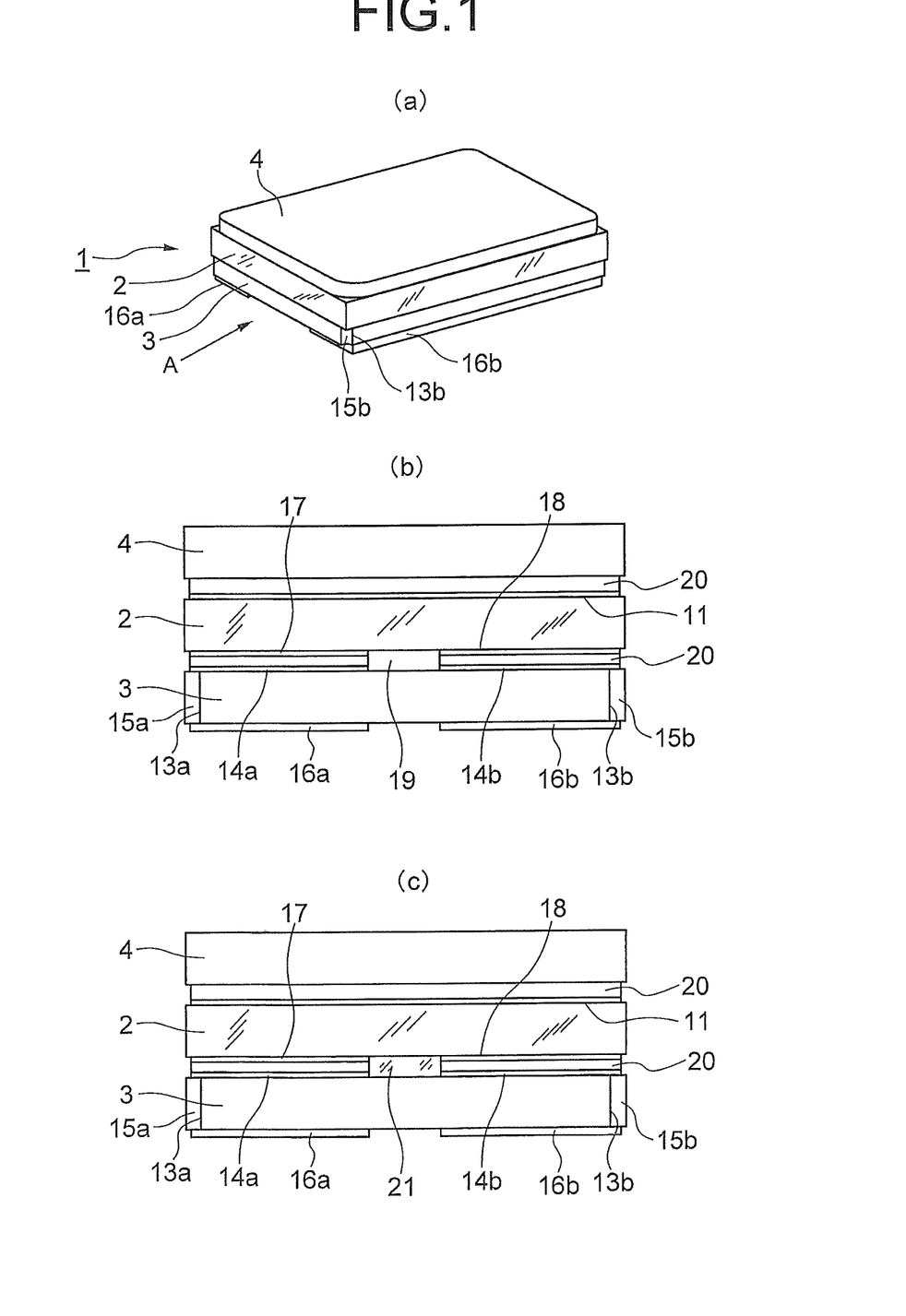
FIG. 1 is a diagram for explaining an embodiment of a surface mount type crystal unit according to the present invention.
Figure 2:
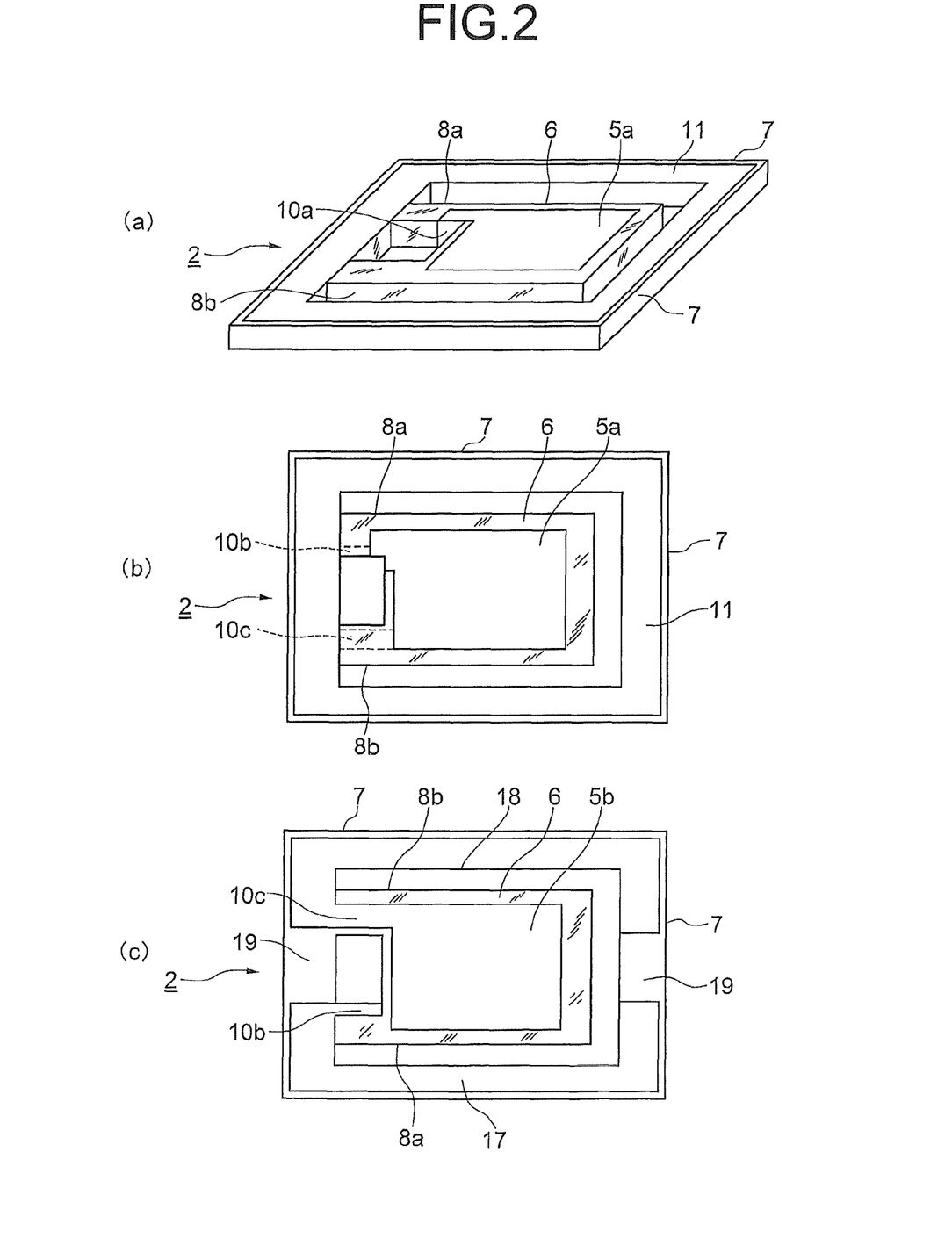
FIG. 2 is a diagram for explaining an embodiment of a framed crystal plate of the surface mount type crystal unit according to the present invention.
Figure 3:
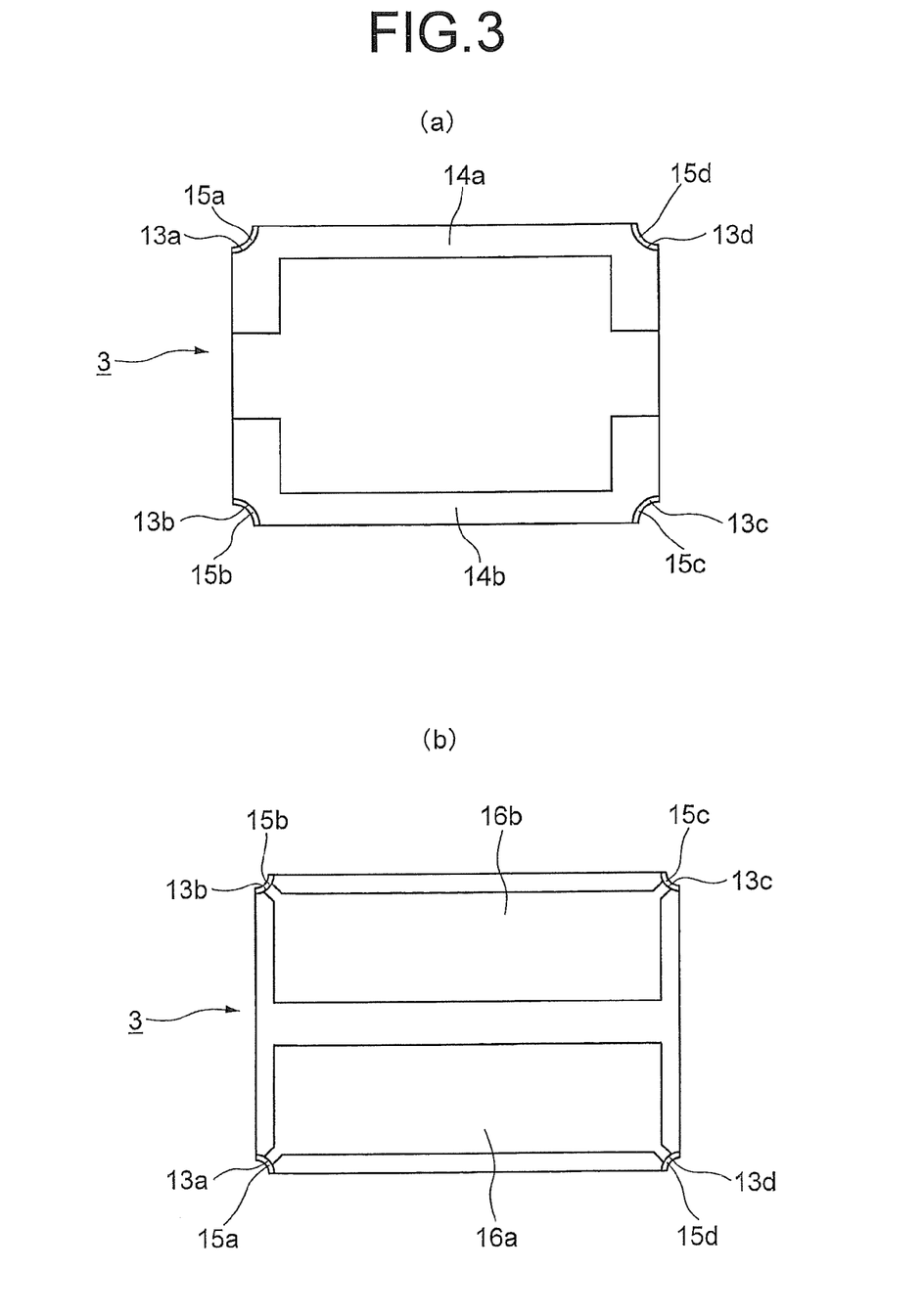
FIG. 3 is a diagram for explaining an embodiment of a base of the surface mount type crystal unit according to the present invention.

FIG. 1 to FIG. 3 are diagrams for explaining an embodiment of a surface mount type crystal unit according to the present invention. FIG. 1 (*a*) is a perspective view thereof, FIG. 1 (*b*) is a side view (before filling glass), and FIG. 1 (*c*) is a side view (after filling glass). FIG. 2 (*a*) is a perspective view of a framed crystal plate, FIG. 2 (*b*) is a plan view of one principal surface of the framed crystal plate, and FIG. 2 (*c*) is a plan view of the other principal surface. FIG. 3 (*a*) is a plan view of one principal surface of a base, and FIG. 3 (*b*) is a plan view of the other principal surface. Like reference numbers are given to like parts as in the conventional example, and explanation thereof is simplified or omitted.

As shown in FIG. 1 to FIG. 3, a surface mount type crystal unit 1 according to the present invention is obtained by bonding a base 3 made of ceramic and a cover 4 made of Kovar to opposite principal surfaces of a framed crystal plate 2.

As shown in FIG. 2, the framed crystal plate 2 includes an oscillating part 6 having a first excitation electrode 5a and a second excitation electrode 5b on the opposite principal surfaces thereof, a frame 7 surrounding the oscillating part 6, and a first connecting part 8a and a second connecting part 8b that extend from opposite sides of one end of the oscillating part 6 to connect the oscillating part 6 with the frame 7.

A frame metal film 11 is formed all around the principal surface of the frame 7 facing the cover 4 (refer to FIG. 2 (*b*)). A first metal film 17 is formed in one area of the principal surface of the frame 7 facing the base 3, of two areas formed by dividing the principal surface at two positions around the circumferential direction, and a second metal film 18 is formed in the other area (refer to FIG. 2 (*c*)). Because there is a gap area 19 between the first metal film 17 and the second metal film 18, the first metal film 17 and the second metal film 18 are electrically separated.

Moreover, the first excitation electrode 5a facing the cover 4 is electrically connected to the first metal film 17 via an electrically-conducting path 10a formed on a side surface of the first connecting part 8a and an electrically-conducting path 10b formed on the principal surface thereof facing the base 3. The second excitation electrode 5b facing the base 3 is electrically connected to the second metal film 18 via an electrically-conducting path 10c formed on the principal surface of the second connecting part 8b facing the base 3.

The framed crystal plate 2, the cover 4, and the base 3 are bonded together by using a eutectic alloy (for example, AuGe, AuSi, AuSn, or SnAgCu) serving as a sealing material 20 formed on the surfaces of the first metal film 17, the second metal film 18, and the frame metal film 11 (refer to FIG. 1 (*b*)). Glass 21 is filled in the gap area 19 between the first metal film 17 and the second metal film 18 (refer to FIG. 1 (*c*)).

Moreover, as shown in FIG. 3, base notches 13a to 13d are formed at four corners of the base 3 in a planar view. A base metal film 14a facing the first metal film 17 formed on the crystal plate 2 and a base metal film 14b facing the second metal film 18 are respectively formed on the base 3 (refer to FIG. 3 (*a*)). The base metal film 14a is electrically connected to a mounting terminal 16a formed on the principal surface of the base 3, which is an external bottom face of the surface mount oscillator 1, via base end-face electrodes 15a and 15d formed on the side portions of the base notches 13a and 13d.

The base metal film 14b is also electrically connected to a mounting terminal 16b formed on the principal surface of the base 3, which is an external bottom face of the surface mount oscillator 1, via base end-face electrodes 15b and 15c formed on the side portions of the base notches 13b and 13c. The mounting terminals 16a and 16b are formed at opposite ends of the external bottom face of the surface mount oscillator 1.

Electrical connection of the surface mount oscillator according to the present invention can be summarized as follows. That is, the first excitation electrode 5a is electrically connected to the mounting terminal 16a via the electrically-conducting paths 10a and 10b, the first metal film 17, the base metal films 14a, and the base end-face electrodes 15a and 15d. Moreover, the second excitation electrode 5b is electrically connected to the mounting terminal 16b via the electrically-conducting path 10c, the second metal film 18, the base metal film 14b, and the base end-face electrodes 15b and 15c.

In the production of such a surface mount oscillator, a crystal wafer (not shown) is first etched in a wafer level to integrally form the framed crystal plate 2 including the oscillating part 6, the frame 7, and the first and second connecting parts 8a and 8b. Then the first and second excitation electrodes 5a and 5b, the electrically-conducting paths 10a to 10c, the frame metal film 11, and the first and second metal films 17 and 18 are formed by deposition or sputtering as a laminated film, with a Cr film being a lower layer and an Au film being an upper layer.

Moreover, the base 3 is formed by firing and dividing a ceramic green sheet (not shown). The base metal films 14a and 14b, the base end-face electrodes 15a to 15d, and the mounting terminals 16a and 16b are formed as a laminated film, with a tungsten (W) film being a lower layer, an Ni film being a middle layer, and an Au film being an upper layer.

Subsequently, the framed crystal plate 2, the cover 4, and the base 3 are bonded together by using a eutectic alloy (for example, AuGe, AuSi, AuSn, or SnAgCu) serving as the sealing material 20. At this time, because the framed crystal plate 2 and the base 3 are bonded by the sealing material 20 formed on the surfaces of the first metal film 17 and the second metal film 18, the gap area 19 for connecting the inside and the outside of the surface mount oscillator 1 is formed between the first metal film 17 and the second metal film 18 (refer to FIG. 1 (b)).

Next the surface mount oscillator 1 is placed in vacuum and metal gas or the like generated in the surface mount oscillator 1 is discharged (refer to FIG. 1 (b)). Lastly, molten glass is poured into the gap area 19, cooled, and solidified, thereby filling the gap area 19 with the glass 21, and hermetically sealing the oscillating part 6 (refer to FIG. 1 (c).

According to such a configuration, metal gas or the like generated when the framed crystal plate 2, the cover 4, and the base 3 are bonded together is discharged to the outside of the surface mount oscillator 1 from the gap area 19 before hermetical sealing. As a result, a change with the lapse of time in the frequency characteristics of the surface mount oscillator 1 can be suppressed. Moreover, since the gap area 19 is filled with the glass 21, airtightness of the surface mount oscillator 1 can be sufficiently maintained.

Moreover, at the time of forming the surface mount oscillator 1, a eutectic alloy is used for bonding. At this time, the surface mount oscillator 1 is heated to a predetermined temperature. Because the framed crystal plate 2 and the base 3 are made of different materials and have a different coefficient of thermal expansion, a stress is applied to the framed crystal plate 2 and the base 3. However, at the time of bonding by using the eutectic alloy, there is the gap area 19 between the first metal film 17 and the second metal film 18, and hence, the stress due to a difference in the coefficient of thermal expansion can be absorbed by the gap area 19. As a result, the possibility of occurrence of breakage or the like in the framed crystal plate 2 and the base 3 due to the stress can be considerably reduced.

Figure 4:
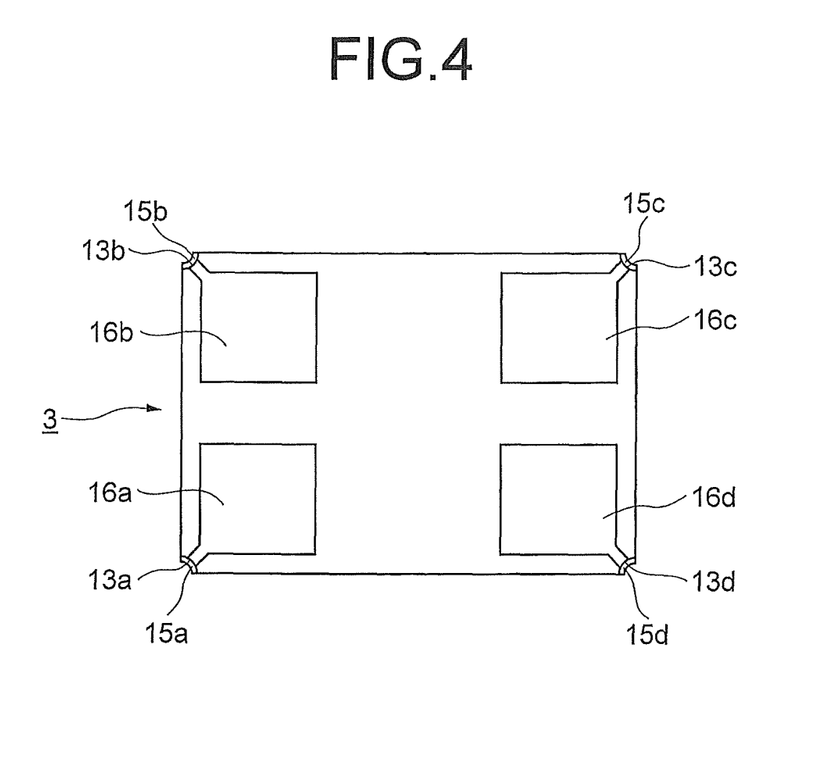
FIG. 4 is a plan view for explaining a first modified example of the base.

FIG. 4 is a plan view of the base 3 for explaining a first modified example of the embodiment of the surface mount type crystal unit according to the present invention, and shows a rear surface of the surface mount oscillator 1. In the present modified example, four mounting terminals 16 are provided on a rear surface of a base 3. At this time, mounting terminals 16a and 16d, and mounting terminals 16b and 16c have the same potential, respectively. The surface mount oscillator 1 in the present modified example is used, for example, for a surface mount oscillator in which a set substrate (not shown) includes four mounting terminals.

Figure 5:
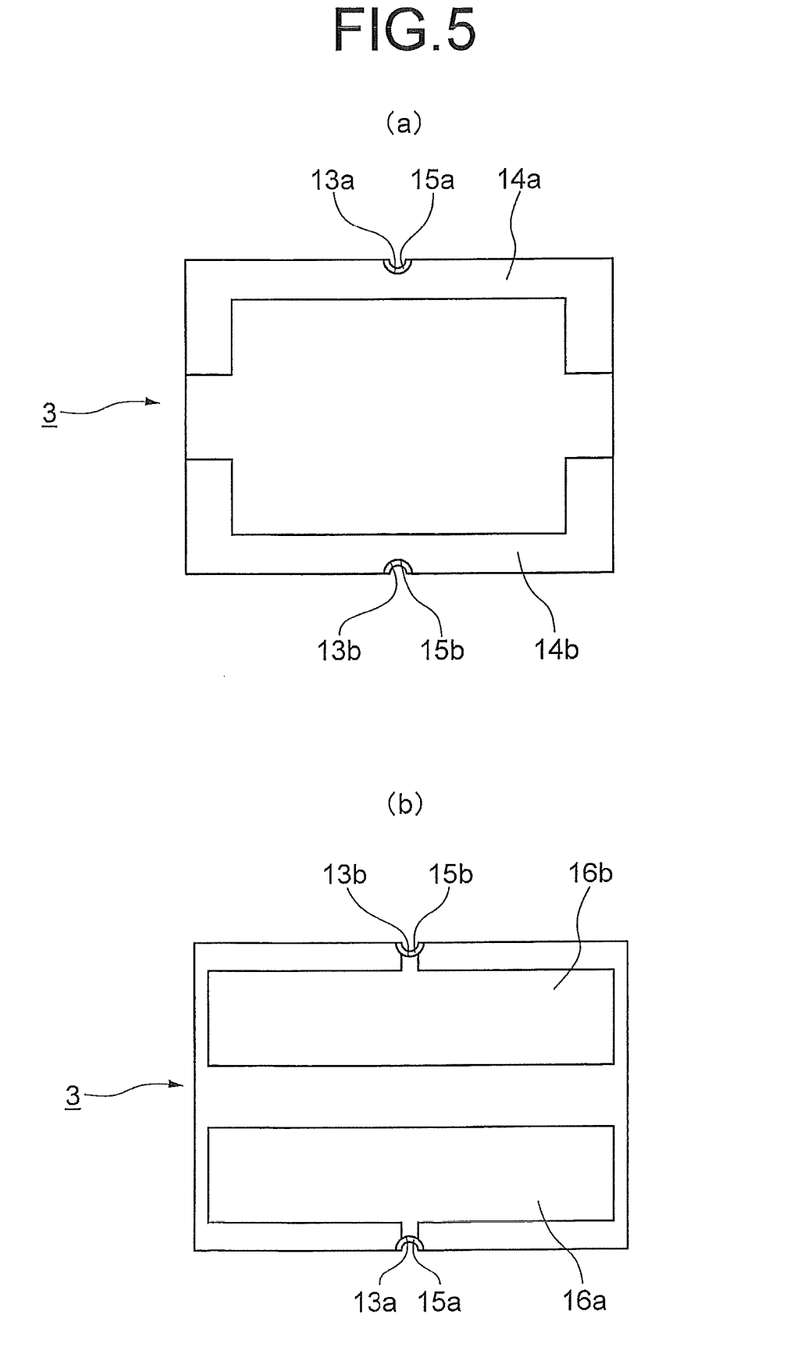
FIG. 5 is a diagram for explaining a second modified example of the base.

FIG. 5 is a diagram for explaining a second modified example of the embodiment of the base 3. FIG. 5 (a) is a plan view of one principal surface thereof, and FIG. 5 (b) is a plan view of the other principal surface. In the present modified example, a base notch 13 is provided one each on opposite sides, on which a gap area 19 is not formed.

Figure 6:
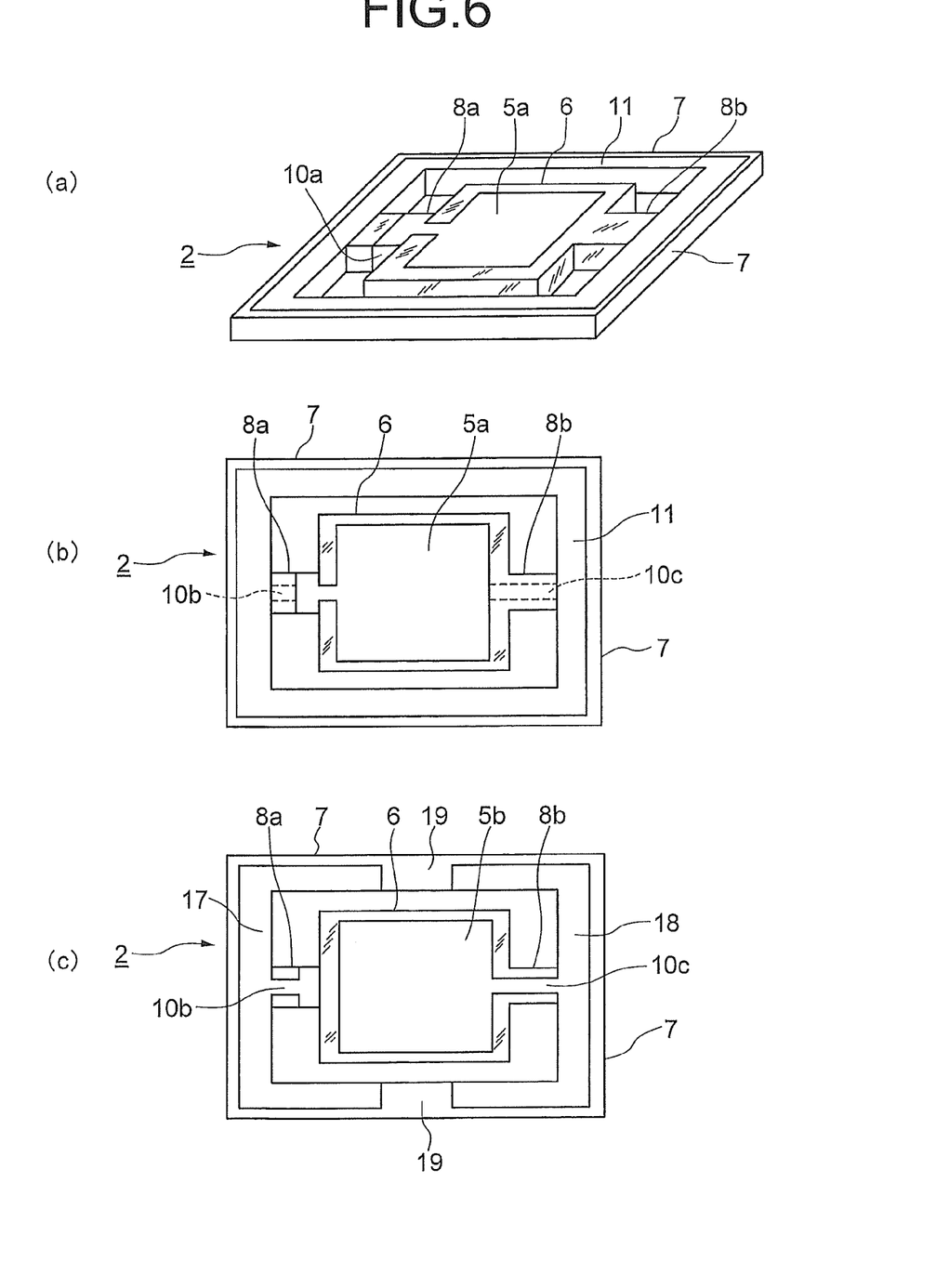
FIG. 6 is a diagram for explaining a third modified example of the framed crystal plate.
Figure 7:
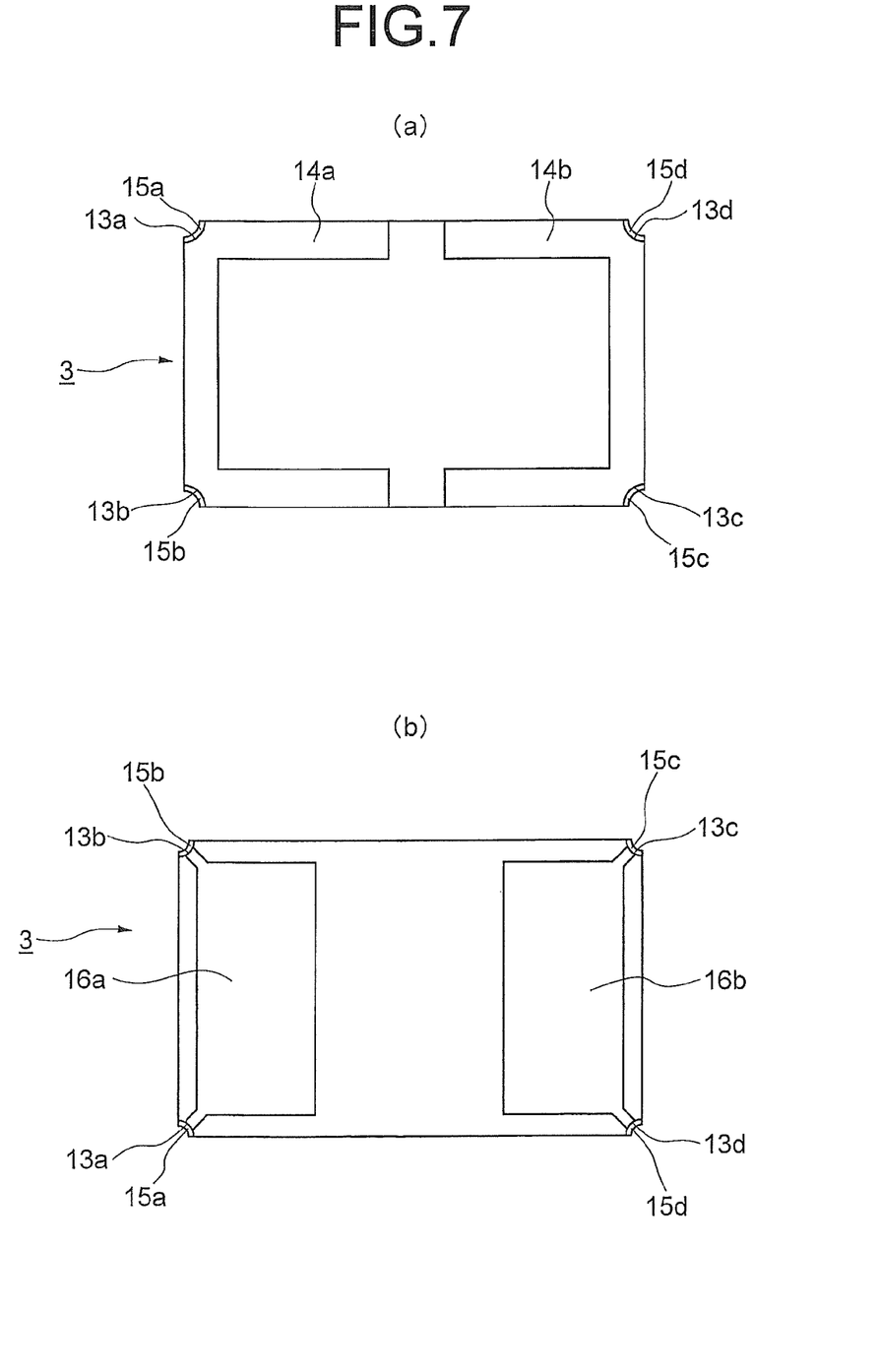
FIG. 7 is a diagram for explaining a third modified example of the base.

FIG. 6 and FIG. 7 are diagrams for explaining a third modified example of the embodiment of the surface mount oscillator according to the present invention. FIG. 6 (a) is a perspective view of the framed crystal plate, FIG. 6 (b) is a plan view of one principal surface thereof, and FIG. 6 (c) is a plan view of the other principal surface. FIG. 7 (a) is a plan view of one principal surface of the base, and FIG. 7 (b) is a plan view of the other principal surface.

In the present modified example, an oscillating part 6 and a frame 7 are connected by a first connecting part 8a and a second connecting part 8b provided at opposite ends of the oscillating part 6 (refer to FIG. 6). A first excitation electrode 5a is electrically connected to a mounting terminal 16a via an electrically-conducting path 10a formed on the side surface of the first connecting part 8a, an electrically-conducting path 10b formed on a principal surface of the first connecting part 8a facing a base 3, a first metal film 17, a base metal film 14a, and base end-face electrodes 15a and 15b. A second excitation electrode 5b is electrically connected to a mounting terminal 16b via an electrically-conducting path 10c formed on a principal surface of the second connecting part 8b facing the base 3, a second metal film 18, a base metal film 14b, and base end-face electrodes 15c and 15d. In the present modified example, the base 3 shown in FIG. 4 can be used. At this time, the mounting terminals 16a and 16b, and the mounting terminals 16c and 16d have the same potential, respectively.

In the embodiment described above, a process for placing the surface mount oscillator 1 in a vacuum is provided before filling the gap area 19 with glass, to discharge the metal gas or the like generated in the surface mount oscillator 1 from the gap area 19 to the outside. However, because a certain amount of gas or the like is naturally discharged from the gap area 19 before the gap area 19 is filled with the glass 21, the process may not need to be provided.

In the above-described embodiment and modified examples, Kovar is used for the cover 4, and ceramic is used for the base 3. However, glass or crystal can be used for the cover 4 and the base 3. Fine machining can be performed by using glass or crystal by using the well-known photolithographic or etching technique. Accordingly, the present invention is effective for downsizing or increasing the complexity of the surface mount oscillator 1.

Here, as the glass, for example, borosilicate glass is used. The Knoop hardness of borosilicate glass is 590 kg/mm$^2$. On the other hand, the Knoop hardness of crystal is 710 to 790 kg/mm$^2$ higher than borosilicate glass. Consequently, when the base 3 and the cover 4 are formed of crystal, the base 3 and the cover 4 can be downsized and the height thereof can be lowered while maintaining strength, as compared to a case in which the base 3 and the cover 4 are formed of borosilicate glass. Moreover, when the base 3 and the cover 4 are formed of crystal, the cover 4, the framed crystal plate 2, and the base 3 are all formed of the same material. As a result, stress due to a difference in the coefficient of thermal expansion is not generated, and hence, breakage or the like due to the stress does not occur. An insulator other than crystal and glass can be used for the base or the cover.

INDUSTRIAL APPLICABILITY

The present invention can be applied to a surface mount oscillator that can support downsizing and increased complexity by enabling fine machining by using glass, crystal, or an insulator other than crystal and glass for a cover and a base of the surface mount oscillator.

The invention claimed is:

1. A surface mount type crystal unit comprising:
a framed crystal plate in which an oscillating part having a first excitation electrode and a second excitation electrode on opposite principal surfaces thereof is surrounded by a frame, and said oscillating part and said frame are connected by a connecting part; and
a base and a cover bonded to opposite principal surfaces of said frame to hermetically seal said oscillating part, wherein
a first metal film is formed in one area of two areas formed by dividing the principal surface of said frame facing said base at two positions around a circumferential direction of said frame, and a second metal film is formed in the other area, said first metal film is electrically connected to said first excitation electrode, said second metal film is electrically connected to said second excitation electrode, said frame and said base are bonded to each other by a sealing material formed on surfaces of said first metal film and said second metal film, and a gap area between said first metal film and said second metal film is filled with glass, thereby hermetically sealing said oscillating part.

2. A surface mount type crystal unit according to claim 1, wherein a first connecting part and a second connecting part are provided as said connecting part, said first excitation electrode facing said cover is electrically connected to said first metal film via an electrically-conducting path fouled on a side surface of said first connecting part and an electrically-conducting path formed on a principal surface thereof facing said base, and said second excitation electrode facing said base is electrically connected to said second metal film via an electrically-conducting path formed on a principal surface of said second connecting part facing said base.

3. A surface mount type crystal unit according to either one of claim 1 and claim 2, wherein said sealing material is made of AuGe, AuSi, AuSn, or SnAgCu.

\* \* \* \* \*